United States Patent [19]

Klein et al.

[11] 4,003,107
[45] Jan. 18, 1977

[54] ONE PIECE PLASTIC PIN FASTENER

[75] Inventors: Keith William Klein, Simsbury; Joseph Michael Palmieri, Southington, both of Conn.

[73] Assignee: General Electric Company, New York, N.Y.

[22] Filed: Oct. 22, 1975

[21] Appl. No.: 624,849

[52] U.S. Cl. .................... 24/73 P; 85/5 R
[51] Int. Cl.² ............................. A44B 21/00
[58] Field of Search ......... 85/5 R, 502, 80, DIG. 2; 24/73 P, 73 PF, 73 PM, 73 PC, 214, 208 A

[56] References Cited
UNITED STATES PATENTS

| | | | |
|---|---|---|---|
| 2,041,336 | 5/1936 | Hall | 24/214 |
| 3,225,641 | 12/1965 | Harris et al. | 85/5 R |
| 3,423,055 | 1/1969 | Fisher | 85/5 R |
| 3,476,008 | 11/1969 | Pearson et al. | 85/5 R |

Primary Examiner—Werner H. Schroeder
Assistant Examiner—Doris L. Troutman
Attorney, Agent, or Firm—Robert A. Cahill; Walter C. Bernkopf; Frank L. Neuhauser

[57] ABSTRACT

A one-piece plastic pin fastener is utilized to secure the assembled position of a plate-like member, such as an electronic circuit board in an electrical receptacle equipped to provide ground fault protection. The headed pin fastener, having a T-shaped shank consisting of a flexible cross-beam and a transverse loading beam, is press-fitted in an undersized bore. The fastener securely holds the circuit board in place, and yet can be removed for servicing and replacement of the electronics.

15 Claims, 11 Drawing Figures

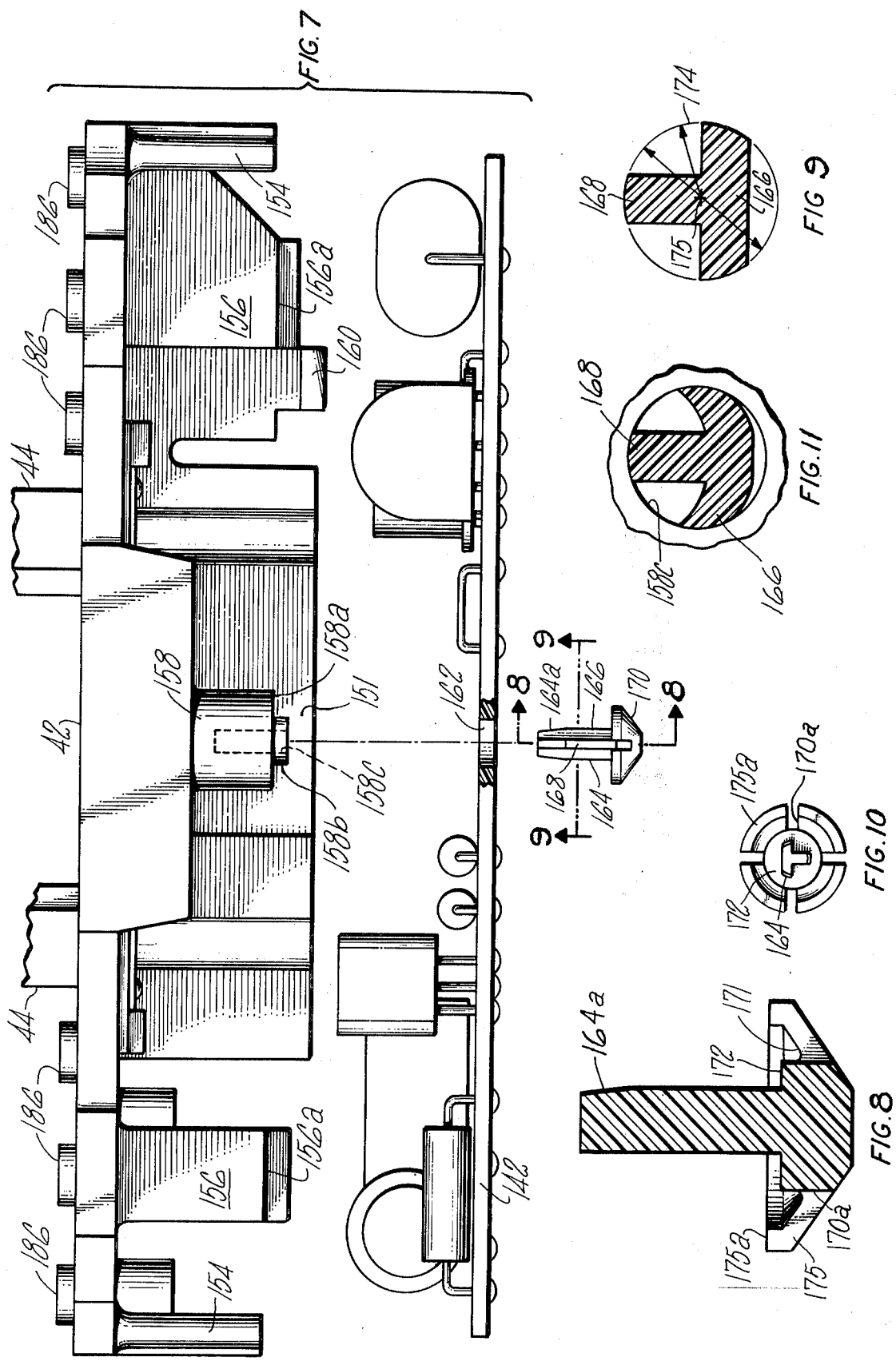

ONE PIECE PLASTIC PIN FASTENER

BACKGROUND OF THE INVENTION

The present invention relates to apparatus for sustaining the assembled position of a plate-like member, and has particular application to securing the assembled position of an electronic circuit board. Heretofore circuit boards have typically been sustained in position through the use of a potting compound. While potting is a highly effective holding agent, it has the distinct disadvantage of being difficult to remove, once hardened. In fact, removal of the potting material invariably results in destruction of the circuit board. Thus servicing and/or salvaging of a potted circuit board is all but impossible.

It is accordingly an object of the present invention to provide apparatus for releasably sustaining the assembled position of a plate-like member, such as an electronic circuit board.

An additional object is to provide apparatus of the above character which utilizes a unique pin fastener to releasably clamp a plate-like member in its assembled position.

Other objects of the invention will in part be obvious and in part appear hereinafter.

SUMMARY OF THE INVENTION

In accordance with the present invention there is provided a one-piece plastic pin fastener which is press-fitted in an undersized opening or bore to clamp an apertured member in place. The pin fastener is uniquely structured to achieve effective frictional engagement with the bore sidewall such as to inhibit inadvertent removal of the pin fastener and yet accommodate intended removal as for the purpose of disassembly.

To this end, the pin fastener is equipped with an elongated shank of T-shaped cross-section consisting of a flexible cross beam and a transverse loading beam joined to the cross beam at substantially its mid-length for the entire shank length. An enlarged head is joined to one end of the shank. When the shank is inserted in an undersized bore, the free edge portions of the beam engage the bore sidewall causing the cross beam to flex. The cross beam, in its flexed or loaded condition, constitutes an exceptionally powerful spring capable of achieving strong fictional engagement of the free edge portions of the cross beam and loading beam with the bore sidewall along a substantial portion of the shank length. To enhance the total surface area of this frictional engagement, the free edge portions of the beams are formed as arcuate sections lying on a common circle whose center lies on the mid-line of the loading beam at its junction with the cross beam. The diameter of this circle is made somewhat larger than the diameter of the bore into which the shank is inserted.

The head of the pin fastener, under which the member is clamped, is preferably provided with radiating slots to create flexible web sections. These web sections provide a measure of resiliency to the clamping pressure exerted on the member by the head. This is an important feature when securing an electronic circuit board in place as excessive clamping pressures can fracture the circuit board.

The invention accordingly comprises the features of construction and arrangement of parts which will be exemplified in the construction hereinafter set forth, and the scope of the invention will be indicated in the claims.

For a fuller understanding of the nature and objects of the present invention, reference should be had to the following detailed description taken in conjunction with the accompanying drawings, in which:

FIG. 7 is an exploded side elevational view illustrating the mounting within the receptacle of the electronic circuit board of FIG. 4;

FIG. 8 is an enlarged sectional view of the pin fastener of FIG. 7, taken along line 8—8;

FIG. 9 is an enlarged sectional view of the pin fastener of FIG. 7, taken along line 9—9;

FIG. 10 is an end view of the pin fastener of FIG. 7; and

FIG. 11 is a transverse sectional view illustrating the operation of the pin fastener in securing the circuit board to the support plate of FIG. 7.

Like reference numerals refer to like parts throughout the several views of the drawings.

DETAILED DESCRIPTION

The present invention is disclosed as being utilized in a ground fault circuit interrupting (GFCI) receptacle as described in detail in applicants' copending application entitled "Ground Fault Receptacle", Ser. No. 624,720, filed concurrently herewith (Docket 41D-1729). It will be appreciated that the pin fastener of the present invention has general usage in a variety of applications where it is desired to releasably sustain a member in place.

The receptacle, in which the present invent is utilized, will now be generally described with the understanding that a detailed understanding of its construction and operation may be had from the above-noted copending application, the disclosure of which is specifically incorporated herein by reference.

Figure 1:
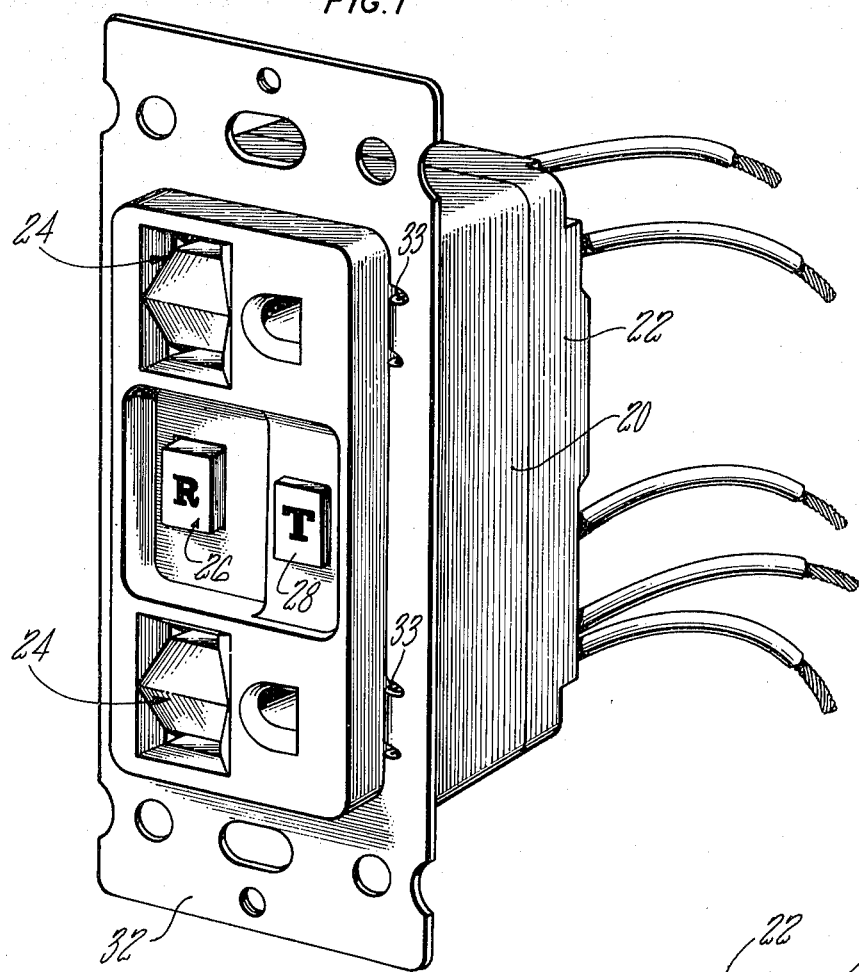
FIG. 1 is a perspective view of an electrical receptacle utilizing the pin fastener of the present invention.
Figure 2:
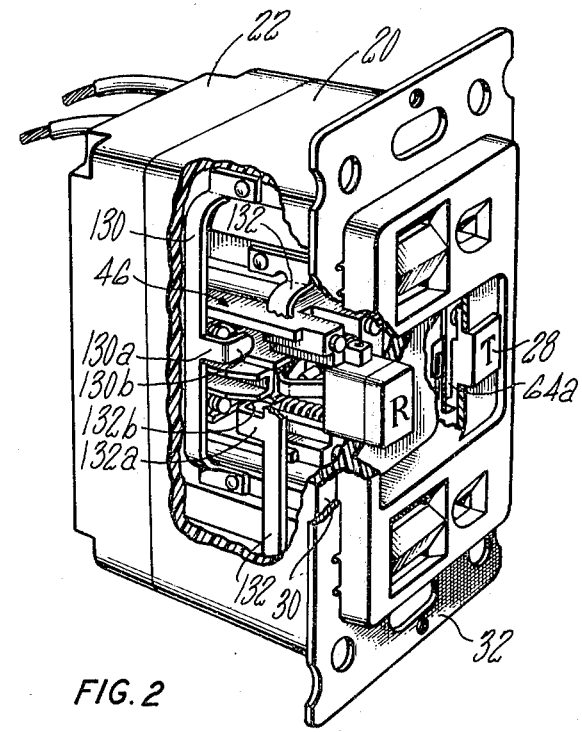
FIG. 2 is a perspective view, partially broken away, of the receptacle of FIG. 1.

The electrical receptacle, as seen in FIG. 1, includes an insulative housing consisting of a deep base 20 and a shallow back cover 22 molded of suitable insulative plastic material. The front wall of base 20 is formed with a plurality of slotted openings into the base interior arranged to provide a pair of female sockets, each generally indicated at 24, in traditional duplex receptacle fashion for receiving conventional two and three-pronged appliance cord plugs. The central recessed portion of the base front wall is formed having apertures through which a reset operator 26 and a test button 28 protrude for convenient digital manipulation. The sidewalls of base 20 are provided with shoulders 30 (FIG. 2) for seating a conductive mounting plate 32 utilized in installing the receptacle in a conventional wall outlet box.

Figure 3:
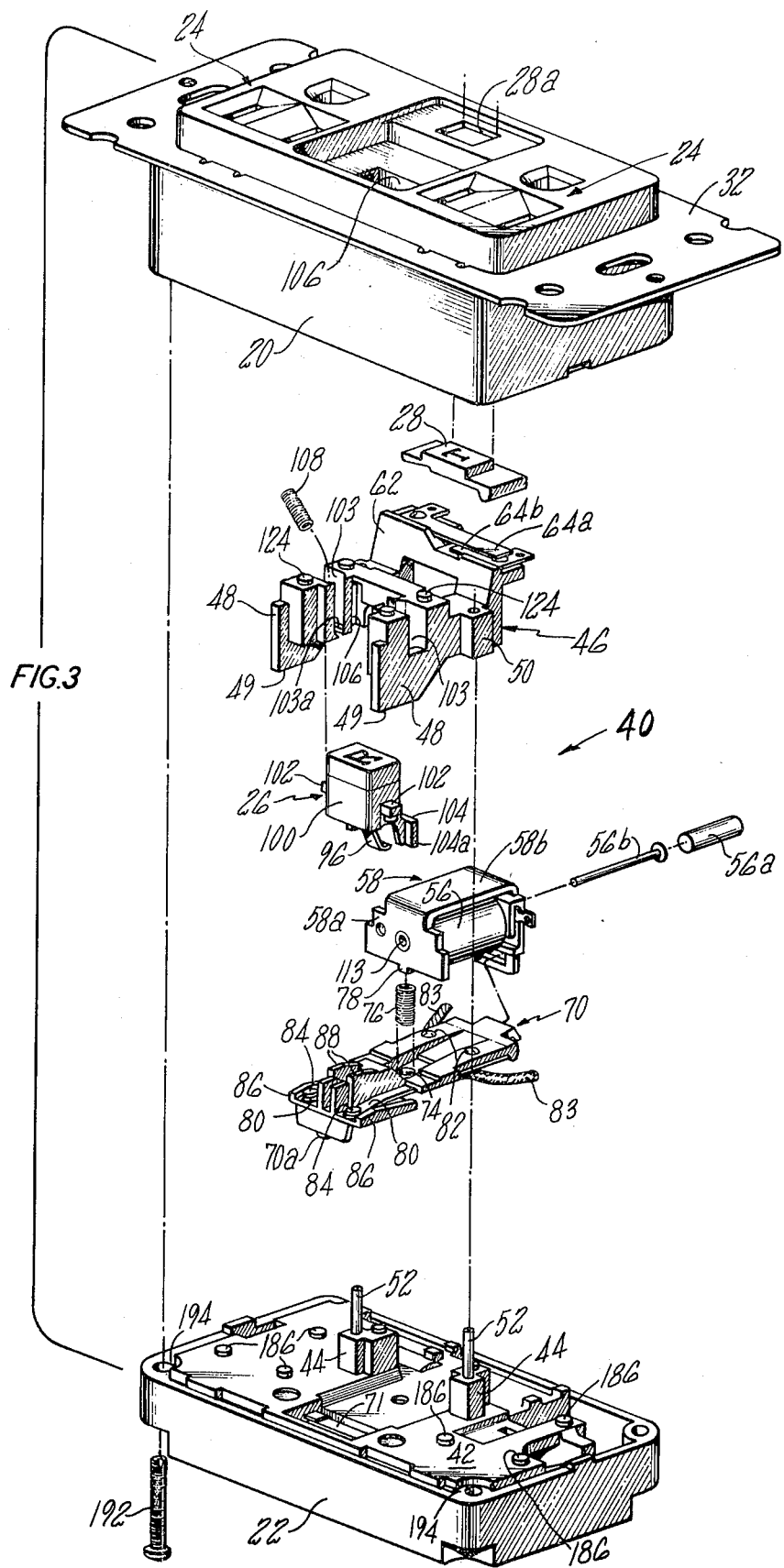
FIG. 3 is an exploded perspective view of the receptacle of FIG. 1.

Turning to FIG. 3, an operating mechanism sub-assembly, generally indicated at 40, is affixed to a generally rectangular support plate 42 positionally mounted in base 20 proximate its junction with back cover 22. Plate 42 is formed with a pair of laterally spaced pedestals 44 on which is seated a mounting block, generally indicated at 46, supporting the various operating mechanism parts. Mounting block 46 is formed having laterally spaced sidewalls 48 in which are provided vertical columns 50 resting on pedestals 44. The columns 50 and pedestals 44 are formed with aligned through bores which receive rivets 52 serving to affix the operating mechanism sub-assembly 40 to mounting plate 42. Mounting block 46 is additionally provided with laterally spaced feet 49 which rest on the upper surface of plate 42 to give the operating mechanism sub-assembly a stable four point stance.

A trip solenoid sub-assembly, as best seen in FIG. 3, includes a solenoid coil 56 mounted in an inverted U-shaped magnetic frame 58. The left depending leg 58a of magnetic frame 58 is of enlarged width such that its lateral edge portions provide flanges for receipt from below in opposed, vertical grooves (not shown) formed in sidewalls 48.

Bridging segment 62, in its extension between the mounting block sidewalls 48, is formed in a two-tiered upper surface configuration for mounting a pair of reed switch contacts 64a, 64b. Upon positioning of the operating mechanism sub-assembly 40 within cover 20, elongated switch contact 64a is located immediately beneath test button 28 captured in base front wall opening 28a. Upon depression of test button 28, the contact 64a is flexed into engagement with contact 64b to complete a circuit path causing simulated ground leakage current to flow. Thus, depression of the test button should cause the receptacle to trip and de-energize its sockets 24. This approach to testing ground fault circuit interrupting devices for operability is well known in the art.

An elongated arm 70 is disposed between mounting block 46 and mounting plate 42 for extension between the pedestals 44 and the mounting block feet. The right end of arm 70 is pivotally mounted by the rear depending leg of magnetic frame 58. Arm 70 is provided with a well 74 (FIG. 4) at approximately its mid-length for accommodating the lower portion of a compression spring 76. The upper end portion of spring 76 embraces a tit 78 depending from the bottom edge of magnetic frame leg 58a. From the description thus far, it is seen that arm 70 is pivotally mounted adjacent its right end, with spring 76 urging the left end of the arm downwardly toward mounting plate 42.

Arm 70 carries a pair of elongated conductive strips 80 which are secured in place by rivets 82. Conductive braids 83 connect the strips to the two sides of a power distribution circuit. The left ends of these strips carry fixed contacts 84 which receive backing from underlying laterally extending flanges 86 integrally formed with arm 70.

Reset operator 26 is formed having a body or button portion 100 having opposed laterally extending lugs 102 which are loosely received in opposed, vertically extending slots 103 formed in sidewalls 48 of mounting block 46. Legs 104 depending from the operator body 100 are provided with laterally outwardly extending flanges 104a which are received in downwardly opening grooves 106 formed in the mounting block sidewall 48. Compression springs 108 seated by ledges 103a in the lower ends of slots 103 act on lugs 102 to bias the operator 26 upwardly for protrusion through the opening 106 in the base front wall.

Latch 96 mounted in reset operator 26 is controlled by digital depression of the operator to latchably engage arm 70. Springs 108 overpower spring 76 to raise arm 70 to bring contacts 84 into electrically contacting engagement with stationary contacts (not shown) mounted within base 20.

Trip solenoid coil 56 encompasses an armature 56a which, upon coil energization, is sucked inwardly or to the left, driving a plunger 56b, mounted in opening 113 in frame leg 58a, into impact with latch 96. It is thus seen that plunger 56b pivots latch 96 in the clockwise direction to release arm 70, and its spring 76 forces the left end of the arm together with its movable contacts 84 downwardly to a tripped or open circuit position. Springs 108 then become operative to move the reset operator 26 upwardly through opening 106 in the base front wall. Reset operator body 100 is preferably provided with a distinctively colored cap 101 which is exposed above opening 106 while arm 70 is latch up in its closed circuit position. When arm 70 is unlatched by the trip solenoid, springs 108 elevate operator 26 to expose above opening 106 the portion of operator body 100 below cap 101, thus providing a visual trip indication.

Figure 4:
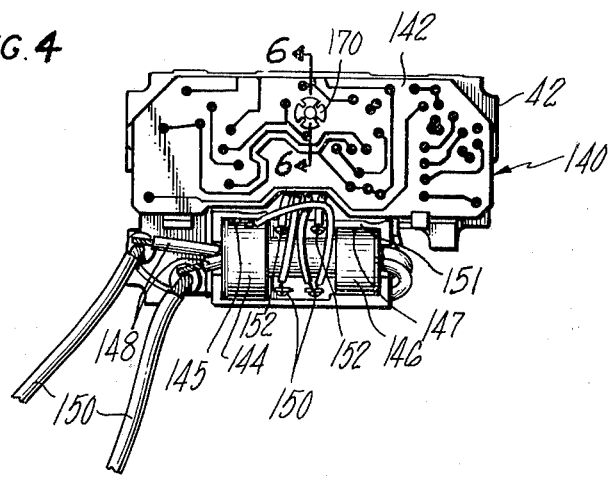
FIG. 4 is a plan view of the magnetics-electronics module mounted in the receptacle of FIG. 1.

The back side of support plate 42 is structured to mount a GFCI module, generally indicated at 140 in FIG. 4. This module includes a circuit board 142 (FIG. 7) on which are mounted electronic components in electrical interconnection. Raised walls 151 formed with support plate 42 provide a pair of cavities in which are accommodated the magnetics of module 140, specifically a differential current transformer 144 in cavity 145 and a neutral excitation transformer 146 in cavity 147. Conductor segments 148, electrically connected via wires 150 emanating through back cover 22, are threaded through the central openings in the transformers. Windings of the transformers are brought out to terminal posts 150 for electrical connection via leads 152 to the electronics.

Circuit board 142 is supported on the ends of side posts 154, ledges 156a formed in posts 156 and on the shoulder 158a of a post 158, all integrally formed in outstanding relation from the rear side of support plate 42. An edge of circuit board 142 is caught under a short laterally extending tab 160 to retain that side of the circuit board seated on shoulders 156a. Neck 158b of post 158 is received through a hole 162 in circuit board 142 in the fashion shown in FIG. 6.

To sustain circuit board 142 in position, a unique pin fastener 164 of the present invention, formed of a suitable, relatively rigid plastic material such as a modified polyphenylene oxide is utilized. As seen in FIGS. 7–11, this pin fastener is formed having an elongated shank of T-shaped cross-section consisting of a cross beam 166 and a transverse loading beam 168 joined to the cross beam at its mid-length along the entire shank length. The shank is joined at one end to a conical head 170 which is undercut at 171 to provide an annular shoulder 172. Head 170 is also slotted, as indicated at 170a, to provide a plurality of resilient webs 175.

Once the circuit board 142 is seated on shoulder 158a of post 158, pin fastener 164 is press-fitted into a central bore 158c in post 158. Initial insertion of the pin fastener is facilitated by a slight taper 164a formed in the leading end of its shank. As best seen in FIG. 11, with insertion of the pin fastener in bore 158c, the exposed edge surfaces of beams 166 and 168, in engaging the bore sidewall, cause cross beam 166 to flex. Proper flexure or loading of beam 166 is insured by loading beam 168. Under such flexure, cross beam 166 constitutes an exceptionally powerful spring effective to achieve strong frictional engagement of the pin fastener in bore 158c, and thus hold the circuit board seated on post shoulder 158a despite even rough handling of the receptacle. Yet, the pin fastener can be removed for servicing and replacement of the electronics.

Figure 6:
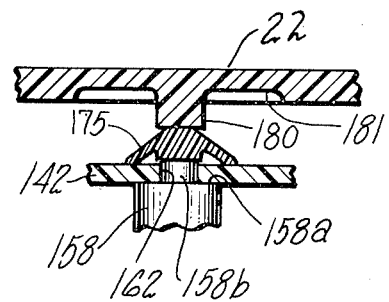
FIG. 6 is a fragmentary sectional view taken along line 6—6 of FIG. 4 with addition of a portion of the rear cover of FIG. 5 to illustrate an application of the pin fastener of the invention.

To maximize the surface area of frictional engagement of pin fastener 164 in bore 158c, the exposed surfaces of the beams are preferably formed (FIG. 9) as arcuate segments lying on a common circle 174 whose center 175 lies on the mid-line of beam 168 at the junction of the beams. The dimensional relationship of the diameter of circle 174 to the diameter of bore 158c depends in large measure on the thickness of beam 166, its length in relation to the thickness of beam 168 and the resiliency of the shank material. It has been found that for bore diameters less than 0.100 inches, adequate frictional engagement of pin fastener 164 in bore 158c is achieved when the diameter of circle 174 is a mere 0.001 inches larger than the bore diameter. As seen in FIGS. 6 and 8, the free, arcuate edges 175a of webs 175 lie below shoulder 172 of pin fastener 164. Consequently, with the circuit board 142 in position on shoulder 158a of post 158 with the neck 158b of the post extending through opening 162 in the circuit board and the pin fastener 164 inserted in bore 158c to the extent that pin shoulder 172 seats on the end of neck 158d, the webs 185 are flexed to resiliently hold the circuit board in position during assembly of the receptacle.

Figure 5:
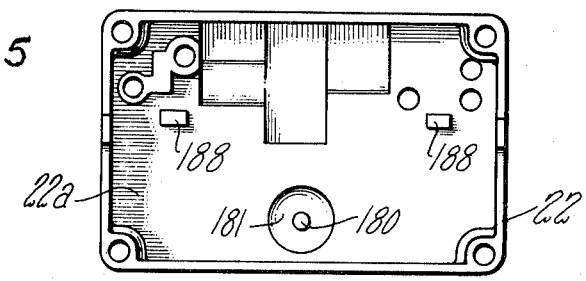
FIG. 5 is a plan view of the rear cover for the receptacle of FIG. 4.

Referring to FIG. 5, it is seen that the rear cover 22 is formed with a post 180 inwardly outstanding from the cover back wall 22a. The cover material surrounding this post is of reduced thickness to provide a resilient web 181, joining the post to the cover backwall 22a. Thus, when the cover is joined with base 20, post 180 is positioned to bear against the head 174 of pin 164. Resilient web 181 permits post 180 to yield so as not to impose undue forces on pin fastener 164 which could crack circuit board 142. It will also be appreciated that the inclusion of resilient web 181 eases manufacturing tolerance requirements.

It will thus be seen that the objects set forth above, among those made apparent in the preceding description, are efficiently attained and, since certain changes may be made in the above construction without departing from the scope of the invention, it is intended that all matter contained in the above description or shown in the accompanying drawings shall be interpreted as illustrative and not in a limiting sense.

Having described our invention, what we claim as new and desire to secure by Letters Patent is:

1. A one-piece plastic pin fastener comprising, in combination:
   A. an elongated shank of T-shaped cross-section consisting of
      1. a flexible, normally straight cross beam arranged transversely to the direction of elongation of said shank, and
      2. a loading beam arranged perpendicular to said cross beam with one end joined to said cross beam at substantially the mid-length of the latter, the junction between said beams extending substantially the full length of said shank,
      3. the ends of said cross beam and the other end of said loading beam each providing smooth, uninterrupted bearing surface extending from one end of said shank along a major portion of the shank length,
      4. whereby, upon insertion of said shank in an undersized bore, said bearing surfaces of said beams engage the bore sidewall causing said cross beam to buckle along its length, said buckled cross beam achieving forceful frictional engagement of said beam bearing surfaces with the bore sidewall to removably secure said shank in the bore, and
   B. an enlarged head joined to said one end of said shank.

2. The pin fastener defined in claim 1, wherein said bearing surfaces of said beams define surface portions of a cylinder.

3. The pin fastener defined in claim 2, wherein the axis of said cylinder intersects the mid-line of said loading beam at its junction with said cross beam.

4. The pin fastener defined in claim 1, wherein said head is formed with radiating slots to thus provide a circular array of flexible web portions.

5. The pin fastener defined in claim 4, wherein said head is conical in shape, the underside of said head being relieved to enhance the flexibility of said web portions.

6. The pin fastener defined in claim 5, wherein the underside of said head is provided with a shoulder at the junction of said head and shank, the free ends of said web portions normally disposed on the shank side of said junction.

7. The pin fastener defined in claim 6, wherein said bearing surfaces of said beams define surface portions of a cylinder.

8. The pin fastener defined in claim 7, wherein the axis of said cylinder intersects the mid-line of said loading beam at its junction with said cross beam.

9. Apparatus for removably retaining a plate-like member in an assembled position, said apparatus comprising, in combination:
   A. a mount having a support surface;
   B. means providing a bore extending into said mount perpendicular to said support surface; and
   C. a one-piece plastic pin fastener including
      1. an elongated shank of T-shaped cross-section consisting of a flexible, normally straight cross beam arranged transversely to the direction of elongation of said shank, and a loading beam arranged perpendicular to said cross beam with one end joined to said cross beam at substantially the mid-length of the latter, the junction between said beams extending substantially the full length of said shank, the ends of said cross beam and the other end of said loading beam each providing a smooth, uninterrupted bearing surface extending from one end of said shank along a major portion of the shank length, and
      2. an enlarged head joined to said one end of said shank,
      3. whereby, upon insertion of said shank through an opening in the member and into said bore, said bearing surfaces of said beams engaged the sidewall of said bore causing said cross beam to buckle along its length, said buckled cross beam achieving forceful frictional engagement of said beam bearing surfaces with the bore sidewall to removably secure said shank in said bore with the member clamped between said head and said support surface.

10. The apparatus defined in claim 9, wherein said bearing surfaces of said beams normally define surface portions of a cylinder having a diameter somewhat greater than the diameter of said bore.

11. The apparatus defined in claim 10, wherein the axis of said cylinder intersects the mid-line of said loading beam and its junction with said cross beam.

12. The apparatus defined in claim 11, wherein said head is formed with radiating slots to thus provide a circular array of flexible web portions resiliently holding the member against said support surface.

13. The apparatus defined in claim 12, wherein said head is conical in shape, the underside of said head being relieved to enhance the flexibility of said web portions.

14. The apparatus defined in claim 13, wherein the underside of said head is provided with a shoulder at the junction of said head and shank, the free ends of said web portions, in their unstressed condition, disposed on the shank side of said junction.

15. The apparatus defined in claim 14, wherein said mount includes a raised portion centrally located on said surface portion, said bore centrally located in said raised portion, and said raised portion extending through the opening in the member and having a height somewhat greater than the thickness of the member, whereby said shoulder engages said raised portion.

* * * * *